US009146271B2

(12) United States Patent
Mutnury et al.

(10) Patent No.: US 9,146,271 B2
(45) Date of Patent: Sep. 29, 2015

(54) IDENTIFYING A SIGNAL ON A PRINTED CIRCUIT BOARD UNDER TEST

(71) Applicant: LENOVO ENTERPRISE SOLUTIONS (SINGAPORE) PTE. LTD., Singapore (SG)

(72) Inventors: Bhyrav M. Mutnury, Austin, TX (US); Nam H. Pham, Round Rock, TX (US); Terence Rodrigues, Austin, TX (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/473,565

(22) Filed: Aug. 29, 2014

(65) Prior Publication Data

US 2014/0368182 A1 Dec. 18, 2014

Related U.S. Application Data

(63) Continuation of application No. 12/785,572, filed on May 24, 2010, now Pat. No. 8,901,946.

(51) Int. Cl.
*G01R 19/00* (2006.01)
*G01R 31/28* (2006.01)

(52) U.S. Cl.
CPC ........ *G01R 31/2813* (2013.01); *G01R 31/2815* (2013.01)

(58) Field of Classification Search
CPC .................. G01R 31/2813; G01R 31/2815
USPC ................. 324/750.01–763.01, 500, 600; 340/572.1
See application file for complete search history.

(56) References Cited

U.S. PATENT DOCUMENTS

| 4,390,837 A | 6/1983 | Hotvedt |
| 5,471,136 A | 11/1995 | Pye |
| 5,574,668 A | 11/1996 | Beaty |
| 5,850,146 A | 12/1998 | Shim et al. |

(Continued)

FOREIGN PATENT DOCUMENTS

| DE | 004004750 A1 | 12/1990 |
| JP | 61022268 A2 | 1/1986 |
| JP | 363117273 A | 5/1988 |

OTHER PUBLICATIONS

Allard et al., "Automatic Semiconductor Chip Electrical Test Prove Alignment System", IBM TDB 11-86, p. 2626-2627, Nov. 1986, IP.com (online publication) prior art database, IP.com No. IPCOM000062402D.

(Continued)

*Primary Examiner* — Melissa Koval
*Assistant Examiner* — Trung Nguyen
(74) *Attorney, Agent, or Firm* — Edward J. Lenart; Katherine S. Brown; Kennedy Lenart Spraggins LLP

(57) ABSTRACT

Apparatus and methods for identifying a signal on a printed circuit board (PCB) under test, including an integrated circuit mounted on the PCB, the integrated circuit having a test signal generator that transmits a test signal to an output pin of the integrated circuit, with the output pin connected to a test point on the PCB; the integrated circuit also having signal identification logic that inserts into the test signal, an identifier of the signal; a test probe in contact with the test point; and a signal-identifying controller that receives the test signal and the identifier from the test probe and displays, in dependence upon the identifier, the identity of the signal.

17 Claims, 7 Drawing Sheets

(56) References Cited

U.S. PATENT DOCUMENTS

| | | |
|---|---|---|
| 5,859,538 A | 1/1999 | Self |
| 6,052,807 A | 4/2000 | Nygaard, Jr. |
| 6,118,288 A | 9/2000 | Kang |
| 6,144,210 A | 11/2000 | Brooks |
| 6,385,762 B1 | 5/2002 | Lahiri et al. |
| 7,072,825 B2 | 7/2006 | Wang et al. |
| 7,162,013 B2 | 1/2007 | Gavette et al. |
| 7,266,463 B2 | 9/2007 | Dixon et al. |
| 7,598,725 B2 | 10/2009 | Bosy et al. |
| 8,030,959 B2 | 10/2011 | Franco et al. |
| 8,278,964 B2 | 10/2012 | Ware et al. |
| 8,373,429 B2 | 2/2013 | Slupsky et al. |
| 2006/0164115 A1 | 7/2006 | Komiya et al. |
| 2011/0279138 A1 | 11/2011 | Mutnury et al. |

OTHER PUBLICATIONS

Office Action U.S. Appl. No. 12/785,572 Nov. 23, 2012 pp. 1-06.
Office Action U.S. Appl. No. 12/785,572 Jul. 25, 2013 pp. 1-08.
Office Action U.S. Appl. No. 12/785,572 Mar. 25, 2014 pp. 1-09.
Notice of Allowance U.S. Appl. No. 12/785,572 Jul. 29, 2014 pp. 1-10.

US 9,146,271 B2

IDENTIFYING A SIGNAL ON A PRINTED CIRCUIT BOARD UNDER TEST

CROSS-REFERENCE TO RELATED APPLICATION

This application is a continuation application of and claims priority from U.S. patent application Ser. No. 12/785,572, filed on May 24, 2010.

BACKGROUND OF THE INVENTION

1. Field of the Invention

The field of the invention is data processing, or, more specifically, methods, apparatus, and products for identifying a signal on a printed circuit board ('PCB') under test.

2. Description of Related Art

A tester approaches a PCB with a test probe. The PCB has hundreds of vias accessible to the probe at test points on the PCB, the vias connecting through the laminate layers of the PCB to ball contacts in ball grid arrays ('BGAs') on one or more flip chips mounted somewhere on the PCB. The tester contacts a test point with the probe and turns to look at a test monitor, an oscilloscope display on which is now displayed the test signal from the test point on the PCB. Here's the problem: What signal is it? What signal does the tester expect to see on the monitor? To which pin on which integrated circuit package is the probe now connected? To which of the hundreds of conductors in fifteen layers of laminate in the PCB is the probe now connected? In high speed electrical lab validation, pins in a BGA or connectors are notoriously hard to identify and probe in a lab environment. The boards, the chip carriers, or the chips themselves, all described in detail in a Computer Aided Design ('CAD') file may be installed in the system in a different orientation than is shown in CAD file. The boards, the chip carriers, or the chips themselves may be flipped over or rotated, for better access. A chip package can have several hundred pins, spaced at a very narrow pitch, making it hard to keep track of the intended pin to be probed. A PCB that would otherwise have silkscreened signal identifiers silkscreened onto a surface of the PCB may have no space around a particular chip to insert silkscreen text, or silkscreened text may be covered by an overhanging heat sink or other component.

SUMMARY OF THE INVENTION

Apparatus and methods for identifying a signal on a printed circuit board ('PCB') under test, including an integrated circuit mounted on the PCB, the integrated circuit having a test signal generator that transmits a test signal to an output pin of the integrated circuit, with the output pin connected to a test point on the PCB; the integrated circuit also having signal identification logic that inserts into the test signal, an identifier of the signal; a test probe in contact with the test point; and a signal-identifying controller that receives the test signal and the identifier from the test probe and displays, in dependence upon the identifier, the identity of the signal.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
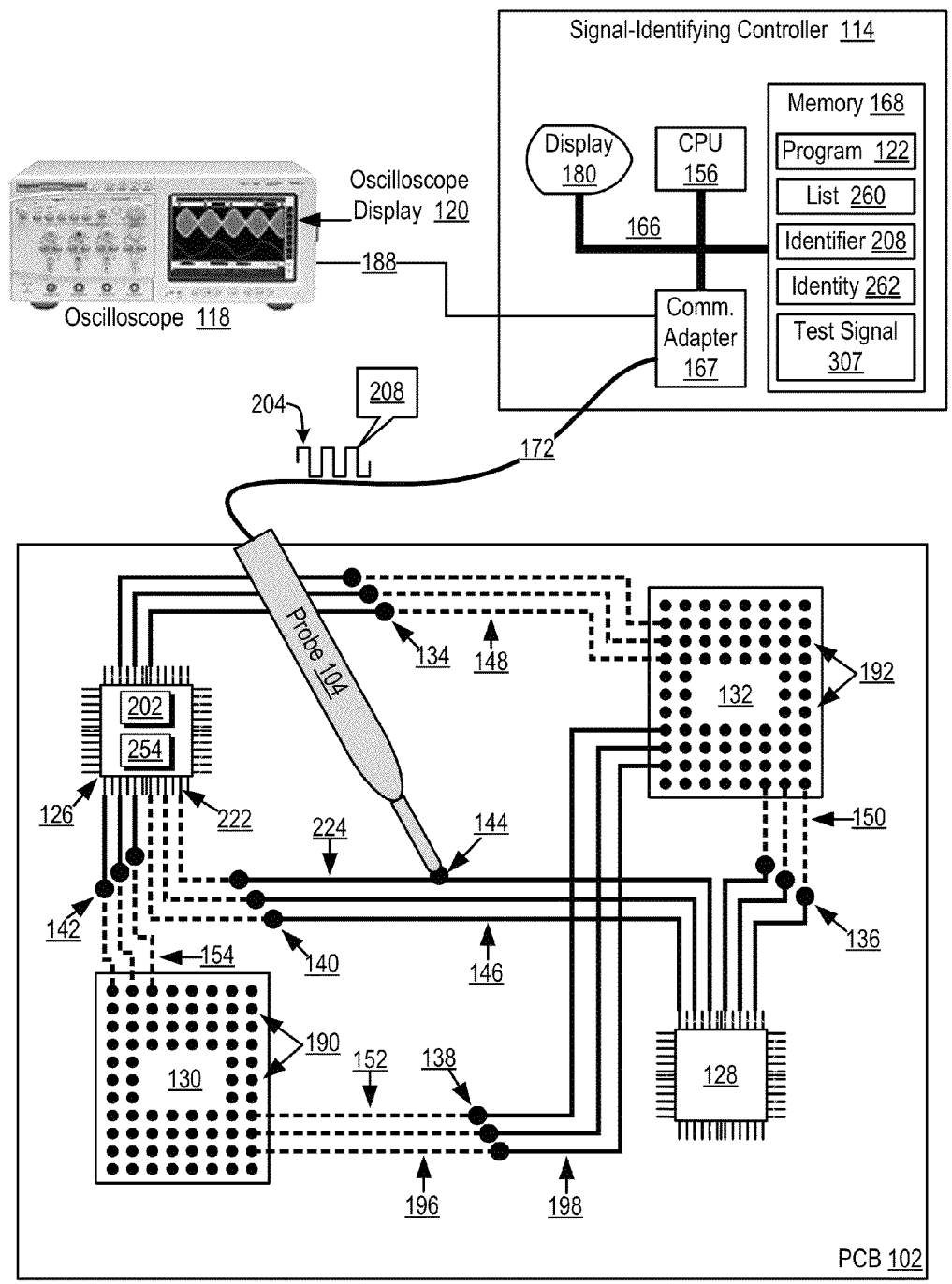
FIG. 1 sets forth a line drawing and functional block diagram of apparatus for identifying a signal on a PCB under test according to embodiments of the present invention.

Example methods, apparatus, and products for identifying a signal on a PCB under test in accordance with the present invention are described with reference to the accompanying drawings, beginning with FIG. 1. FIG. 1 sets forth a line drawing and functional block diagram of apparatus for identifying a signal on a PCB (102) under test according to embodiments of the present invention. The PCB of FIG. 1 includes a number of electronic test points (134, 136, 138, 140, 142). At least some of the test points conduct test signals because one or more of the circuits (126, 128, 130, 132) has been placed in a test mode that generates test signals in test patterns on output pins of the circuit. The four circuits (126, 128, 130, 132) on the PCB are integrated circuits representing two kinds of integrated circuit packaging, two of the circuits (126, 128) are packaged in Thin Quad Flat Packs or 'TQFPs,' and the other two (130, 132) are in Ball Grid Array packages or 'BGAs.' Both TQFP and BGA are forms of surface-mount technology that support many pin connections from a chip through its package to conductors on and in a PCB. The TQFPs (126, 128) in this example are each 52-pin packages, and each BGA (130, 132) in this example is a 76-pin package. These are conservative examples only. Surface mount packages such as these can support many more external connections. Some BGAs have hundreds of pins in their arrays. The actual connection arrays (190, 192) in this example are shown, for ease of explanation, on the top of the BGA packages (130, 132), so that they are visible to readers; readers will recognize that in an actual installation, however, the balls in a Ball Grid Array are positioned under the package, between the package and the top surface of the PCB, where they would not be visible as they are here.

It is said that pin conductors of a PCB are both 'on' and 'in' a PCB because PCBs are typically manufactured with multiple layers of laminate and conductors. For further explanation, FIG. 2 sets forth a cross-sectional plan view of an example multi-layer PCB (40) illustrating features of the kind of PCB typically under test by apparatus for identifying a signal on a PCB according to embodiments of the present invention. The example PCB in FIG. 2 includes layers of laminate (30), several conductors (32, 46, 34) among the layers of laminate, and two vias (10, 20) traversing layers of laminate. The vias are composed of conductive material disposed in holes drilled through layers of laminate. Vias generally are used as electrical conductors through the layers of laminate, connected to conductors in the layers, conductors such as signal lines, ground planes, ground lines, power planes, power lines, and so on. The tops of the vias (10, 20) and the bottom of via (20) here are formed into contact pads (24) that are used as test points in apparatus for identifying a signal on a PCB according to embodiments of the present invention. Via (20) also has a bottom pad (25), but it is buried inside the laminate and cannot be reached by a probe for use as a test point.

Figure 2:
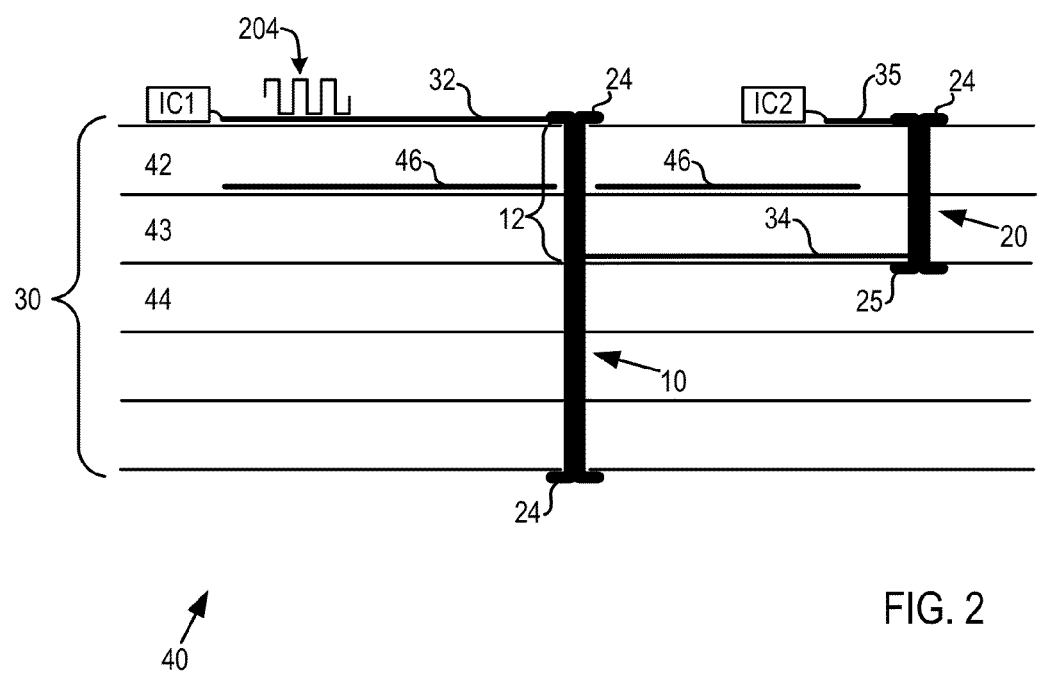
FIG. 2 sets forth a cross-sectional plan view of an example multi-layer PCB illustrating features of the kind of PCB typically under test by apparatus for identifying a signal on a PCB according to embodiments of the present invention.

In the example of FIG. 2, via (10) conducts an alternating current signal (204), test signal embedded with an identifier of a signal, from integrated circuit IC 1 and a conductive trace

(32) on the top layer (42) of the PCB to a trace (34) on an internal layer (44) of the PCB. Via (10) conducts the signal (204) through the top portion (12) of via (10) to trace (34), and the signal then travels through via (20) and trace (35) to integrated circuit IC2. The signal (204) is accessible by probe at test points (24).

The conductors in the laminate in the example PCB of FIG. 2 include a ground plane (46) disposed upon the second layer (43) of laminate. The structure of PCB (40) is simplified here for ease of explanation; readers will recognize that PCBs under test by apparatus for identifying signals on a PCB according to embodiments of the present invention typically will have, not just one or two, but many signal traces, many vias, and many test points. In addition, such PCBs will include not just four or five layers of laminate, but ten layers, twenty layers, or more.

Again referring to FIG. 1: The example PCB (102) of FIG. 1 includes five sets of signal traces (146, 148, 150, 152, 154). PCB (102) is a multi-layer PCB, and the signal traces (146, 148, 150, 152, 154) are disposed upon various laminate layers of PCB (102). The layers are not visible in FIG. 1 because PCB (102) is illustrated in top view only. The fact that the signal traces are disposed upon various levels of PCB (20), therefore, is represented in FIG. 1 by illustrating the traces partly with dotted lines (196) and partly with solid lines (198). Transitions from dotted to solid occur at test points (134, 136, 138, 140, 142), where the traces change layers and are brought out to the top layer through vias, where the traces can be accessed with a test probe.

The example apparatus of FIG. 1 includes a test probe (104). The test probe, connected through a wireline connection (172) to the signal-identifying controller (114), is positioned in contact with test point (144) and conducts to the signal-identifying controller a test signal (204) embedded with an identifier (208) of a signal. In this example, the test signal (204) originates on output pin (226) of integrated circuit (126). The integrated circuit (126) includes a test signal generator (202) that transmits the test signal to the output pin, and the output pin (222) is connected to test point (144) through trace (224). The integrated circuit (126) also includes signal identification logic (254) that inserts into the test signal (204) the identifier (208) of the signal. The identifier (208) itself can be either the actual identity of the signal as such, or the identifier can be only an encoded value that represents the identity of the signal. The process of inserting the identifier into the test signal is explained in more detail below with reference to FIGS. 4 and 5.

The example apparatus of FIG. 1 also includes the signal-identifying controller (114), which is a module of automated computing machinery that receives from the test probe (104) the test signal (204) and the identifier (208) and displays, in dependence upon the identifier, the identity of the signal. It is said that the signal-identifying controller (114) displays 'in dependence upon the identifier' because the identifier can either contain the actual identity of the signal, or the identifier can be an encoded value that only represents the identity of the signal. In embodiments where the identifier (208) of the signal includes the identity of the signal, the signal-identifying controller (114) extracts the identity (262) of the signal from the test signal and displays the identity of the signal on either an integrated display (180) or an oscilloscope display (120). In embodiments where the identifier (208) of the signal is composed of only an encoded value that represents the identity of the signal, the signal-identifying controller (114) extracts the encoded value from the test signal, decodes the encoded value to produce the actual identity (262) of the signal, and displays the identity of the signal on either an integrated display (180) or an oscilloscope display (120).

The signal-identifying controller (114) is represented in this example as a separate component, although it is in other embodiments integrated into a test scope (118), packaged as an integrated circuit and mounted on the PCB (102), integrated into the probe (104) itself, or implemented in other ways as will occur to those of skill in the art. The signal-identifying controller (114) in this example is represented as having a computer processor or 'CPU' (156) connected through a system bus (166) to a computer memory (168) bearing a control program (122), a built-in display (180), and a communications adapter (167). In other embodiments, as a module of automated computing machinery, the signal-identifying controller (114) can be implemented as a microcontroller with a Harvard architecture, as a Complex Programmable Logic Device ('CPLD'), as a Field Programmable Gate Array ('FPGA'), as an Application Specific Integrated Circuit ('ASIC'), entirely as hardware, a combination of hardware and software, and in other ways as will occur to those of skill in the art. In the particular example of FIG. 1, the control program (122) is composed of computer program instructions that operate the CPU (156), a computer processor or microcontroller, to identify signals on the PCB according to embodiments of the present invention.

The signal-identifying controller (114) is also connected to a display, actually, in the example of FIG. 1, two displays, an integrated display (180) and an oscilloscope display (120). The scope connection (188) is preferred, because by its use signals can be both displayed and identified to a user on the same screen at the same time, but other embodiments can include a small display such as a Liquid Crystal Display ('LCD'), for example, on the signal-identifying controller (114) itself. In an embodiment with the signal-identifying controller (114) integrated in to a probe, for example, a user can place the probe at a test point on the PCB and read from a small LCD display on the probe itself the identity of the signal at that test point.

In the particular example embodiment of FIG. 1, the signal-identifying controller (114) includes in its memory (168) a list (124) of signal identities for use in decoding encoded values that represent identities of signals—in embodiments where an identifier (208) of the signal is composed only of an encoded value that represents the identity of the signal. In such embodiments, the example signal-identifying controller (114) of FIG. 1 decodes encoded values by finding, in dependence upon the encoded value in a list of signal identities, the identity of the signal, a process explained further with reference to Table 1.

TABLE 1

Encoded Values And Signal Identities

| Encoded Values | | Signal Identities | | |
|---|---|---|---|---|
| Index Value | Key Value | Component Name | Pin Name | Signal Name |
| 0000 | hash-00 | Pentium ™ | AK08 | A20M# |
| 0001 | hash-01 | Pentium ™ | AJ05 | ADS# |
| 0002 | hash-02 | Pentium ™ | AM02 | ADSC# |
| 0003 | hash-03 | Pentium ™ | V04 | AHOLD |
| 0004 | hash-04 | Pentium ™ | AK02 | AP |
| 0005 | hash-05 | Pentium ™ | AE05 | APCHK# |
| 0006 | hash-06 | Pentium ™ | AL09 | BE0# |
| 0007 | hash-07 | Pentium ™ | AK10 | BE1# |
| 0008 | hash-08 | Pentium ™ | AL11 | BE2# |
| 0009 | hash-09 | Pentium ™ | AL12 | BE3# |
| ... | ... | ... | ... | ... |

Table 1 is an example embodiment of a list (124) signal identities. In the example of Table 1, the signal identities are associated with identifiers of signals in the form of encoded values representing signal identities. Each row in Table 1 represents an association of an encoded value that represents the identity of a signal with information describing the actual identity of the signal. The values in the Index Value and the Key Value columns are encoded values that are associated with particular signal identities in the Component Name, Pin Name, and Signal Name columns. Examples of signal identities include combinations of component names, pin names, signal names, schematic symbol names, and others that will occur to those of skill in the art. In Table 1, the index values and key values are alternative forms of encoded values for representing identities of signals. The index values in the Index Value column are sequential integers, which illustrates the fact that, so long as the list of signal identities is sorted according to such index values, there is no need to actually include such a column of index values in the list—because the position of each entry in the list is already ordered according to the index values, the encoded values. The key values in the Key Value column are represented here as hash values—so that there would be no assurance in using such key values or hash values as encoded values that the values would form a sequence of integers. Using such key values or hash values as encoded values would probably entail including the Key Value column in the list for use in looking up signal identities.

Table 1 includes ten examples of associations of encoded values with particular signal identities, which function to identity signals on a PCB as follows:

For index value 0001: A probe is positioned at a test point, conducting a test signal with an embedded identifier to the signal-identifying controller. The signal-identifying controller receives a test signal with the identifier embedded as an encoded value, the index value 0001, extracts the identifier form the test signal, and decodes the identifier by finding the index value 0001 in Table 1 and retrieving its associated signal identity, thereby identifying the signal whose identity is represented by index value 0001 as Component Name="Pentium™," signifying that the signal available at that test point comes from an Intel Pentium™ processor package on the PCB, Pin Name="AK08," and Signal Name="A20M#," the masking signal for physical address bit 20.

For index value 0002: A probe is positioned at a test point, conducting a test signal with an embedded identifier to the signal-identifying controller. The signal-identifying controller receives a test signal with the identifier embedded as an encoded value, the index value 0002, extracts the identifier form the test signal, and decodes the identifier by finding the index value 0002 in Table 1 and retrieving its associated signal identity, thereby identifying the signal whose identity is represented by index value 0002 as Component Name="Pentium™," signifying that the signal available at that test point comes from an Intel Pentium™ processor package on the PCB, Pin Name="AJ05," and Signal Name="ADS#," the address strobe signal.

For index value 0003: A probe is positioned at a test point, conducting a test signal with an embedded identifier to the signal-identifying controller. The signal-identifying controller receives a test signal with the identifier embedded as an encoded value, the index value 0003, extracts the identifier form the test signal, and decodes the identifier by finding the index value 0003 in Table 1 and retrieving its associated signal identity, thereby identifying the signal whose identity is represented by index value 0003 as Component Name="Pentium™," signifying that the signal available at that test point comes from an Intel Pentium™ processor package on the PCB, Pin Name="AM02," and Signal Name="ADSC#," the address strobe copy signal.

For index value 0004: A probe is positioned at a test point, conducting a test signal with an embedded identifier to the signal-identifying controller. The signal-identifying controller receives a test signal with the identifier embedded as an encoded value, the index value 0004, extracts the identifier form the test signal, and decodes the identifier by finding the index value 0004 in Table 1 and retrieving its associated signal identity, thereby identifying the signal whose identity is represented by index value 0004 as Component Name="Pentium™," signifying that the signal available at that test point comes from an Intel Pentium™ processor package on the PCB, Pin Name="V04," and Signal Name="AHOLD," the address hold signal.

For index value 0005: A probe is positioned at a test point, conducting a test signal with an embedded identifier to the signal-identifying controller. The signal-identifying controller receives a test signal with the identifier embedded as an encoded value, the index value 0005, extracts the identifier form the test signal, and decodes the identifier by finding the index value 0005 in Table 1 and retrieving its associated signal identity, thereby identifying the signal whose identity is represented by index value 0005 as Component Name="Pentium™," signifying that the signal available at that test point comes from an Intel Pentium™ processor package on the PCB, Pin Name="AK02," and Signal Name="AP," the address parity signal.

And so on . . . .

For ease of explanation, Table 1 includes only ten examples of signal identities, but readers will recognize that actual lists of signal identities often will contain many more. The example implementation of a list of signal identities associated with encoded values as Table 1 also is only for ease of explanation, not a limitation of the present invention. A list of signal identities can be implemented as a linked list in computer memory, an array, a C-style structure or 'struct', an array of structures, and so on as will occur to those of skill in the art.

Figure 3:
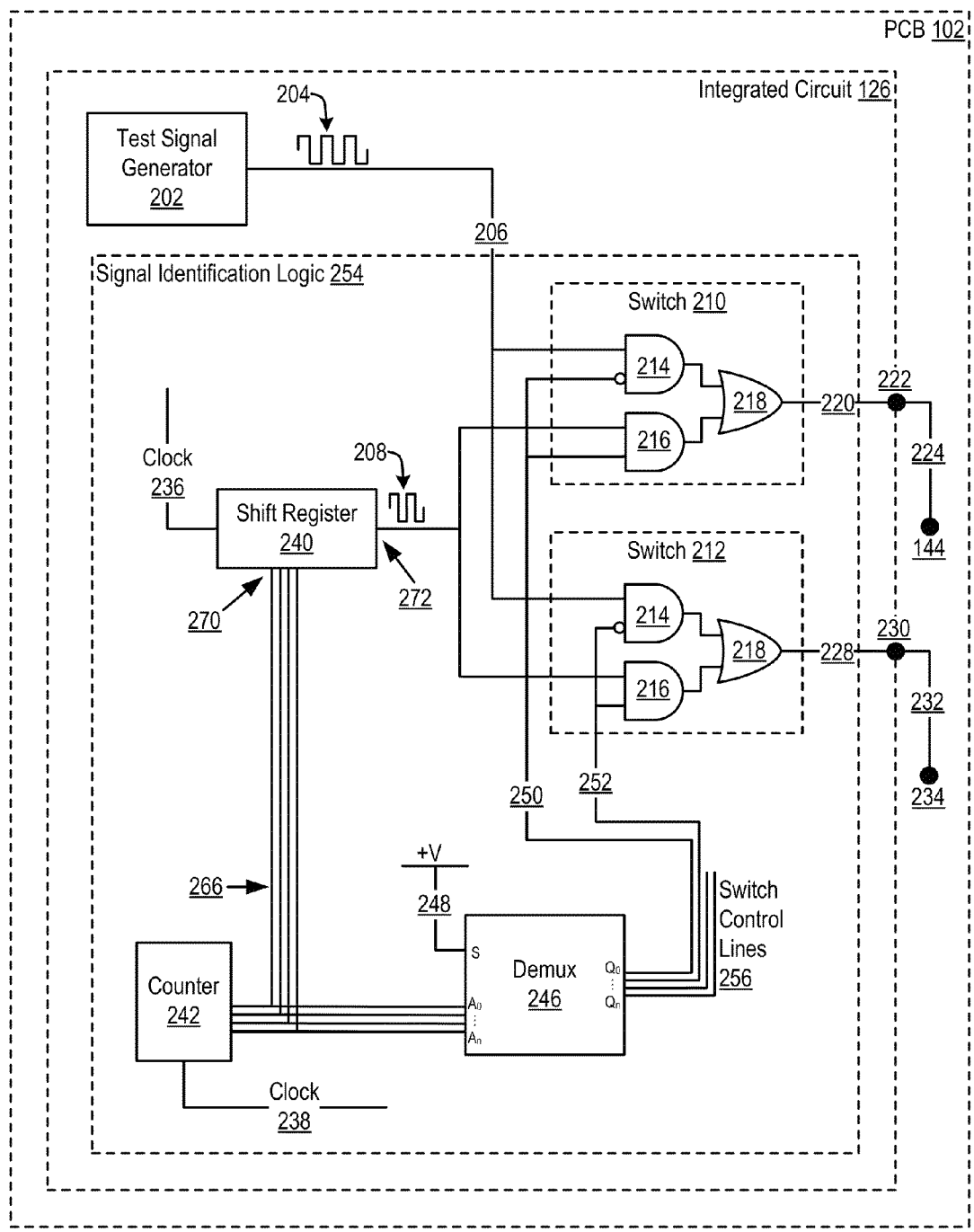
FIGS. 3-4 set forth sets forth schematic diagrams of example signal identification logic for identifying signals on a PCB according to embodiments of the present invention.

For further explanation, FIG. 3 sets forth a schematic diagram of example signal identification logic (254) for identifying signals on a PCB according to embodiments of the present invention. The signal identification logic (254) is a network of digital logic, so that signal values on conductors in the network are described as 'high' or 'low,' 'on' or 'off,' 'active' or 'inactive,' and so on. The signal identification logic (254) is installed in an integrated circuit (126) on a PCB (102) under test. The signal identification logic (254) in this example includes a counter (242), a demultiplexer (246), a shift register (240), and digital switches (210, 212) composed of logic gates (214, 216, 218). Outputs of the switches are connected through internal conductors (220, 228) within the integrated circuit (126) to output pins (222, 230), PCB traces (224, 232), and test points (144, 234). The switches are controlled digitally by switch control lines (256). For convenience of explanation, the example signal identification logic (254) of FIG. 3 includes only two switches (210, 212) connected to only two switch control lines (250, 252), although readers will recognize that typical embodiments of signal identification logic for identifying PCB signals according to embodiments of the present invention include many switch control lines controlling many switches with outputs to many output pins and many test points.

In the signal identification logic (254) in the example of FIG. 3, when switch control lines (250, 252) are low, gates (214) are active, and the switches (210, 212) conduct a test signal (204) from test signal generator (202) to output pins (222, 230) and test points (144, 234). The demultiplexer (246) drives one of the switch control lines (256) high. For the switch with its switch control line high, gate (214) is turned off, gate (216) is turned on, and the switch conducts an identifier of a control pin from shift register (240) to output pins (222, 230) and test points (144, 234), thereby inserting the identifier of the signal into the test signal. When the switch's switch control line again goes low, the switch resumes conducting the test signal (204)—so that the interruption of the test signal for insertion of the identifier is temporary and short.

The switch control lines (256) are driven by the outputs $Q_0 \ldots Q_n$ of the demultiplexer (246). With its signal input 'S' simply tied high through conductor (248) to +V, the demultiplexer (246) drives high the one of the switch control lines (256) selected for output of signal by the address driven onto the address inputs $A_0 \ldots A_n$ of the demultiplexer by the counter (242). The counter (242) is programmed to cycle through a sequence of count values beginning with zero and ending with a count of the number of switch control lines minus one, then starting over at zero, and so on. The count value on the output (266) of the counter, which is also the multiplexer address, always selects exactly one of the switch control lines to drive high and activate exactly one switch to insert one identifier of a signal into the test signal. The $0^{th}$ switch control line is connected to the $0^{th}$ switch. The $1^{st}$ switch control line is connected to the $1^{th}$ switch. The $2^{nd}$ switch control line is connected to the $2^{th}$ switch. And so on, so that the counter value N always exactly corresponds to the output pin connected to the $N^{th}$ switch, thereby encoding a value that represents the identity of the signal transmitted to and through that output pin. The encoded value is presented in parallel to the shift register (240), and the shift register transmits the encoded value serially to the switches, to all of the switches, only one of which is activated. The switch that is activated is the switch that corresponds to the encoded value presently output by the shift register. The clocks (236, 238) are synchronized so that the shift register has time to serialize the encoded value, needing one clock cycle per bit. With, for example, eight address lines (266) in parallel, corresponding to 256 switch control lines, the shift register's clock (236) typically would run at least eight times faster than the counter's clock (238)—giving the shift register time to shift all eight bits from its parallel input (270) to its serial output (272) before the counter (242) and the demultiplexer (246) turn off the currently active switch and turn on the next one.

Figure 4:
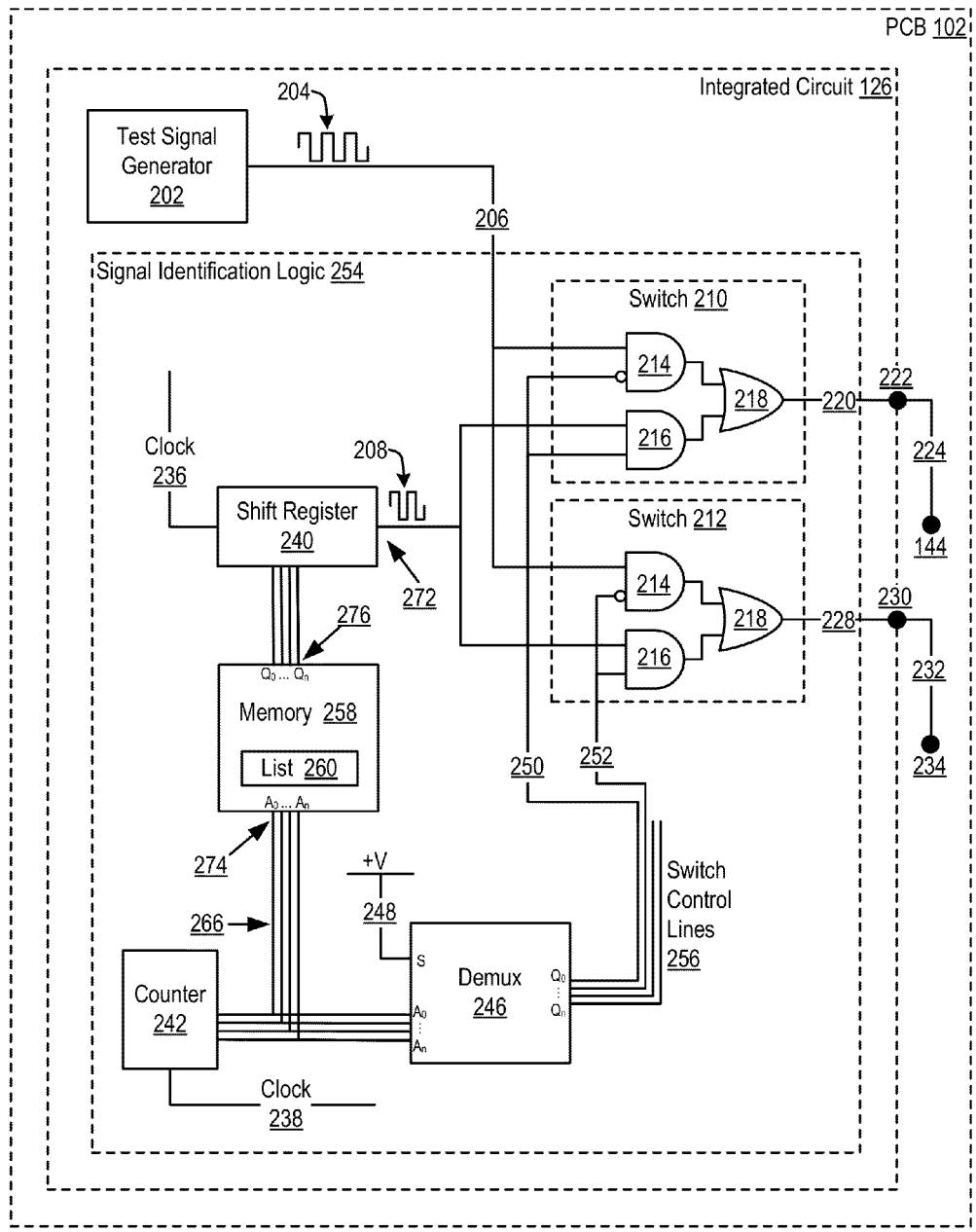

For further explanation, FIG. 4 sets forth a schematic diagram of a further example of signal identification logic (254) for identifying signals on a PCB according to embodiments of the present invention. The signal identification logic (254) of FIG. 4 is similar to the example signal identification logic (254) of FIG. 3, including as it does a counter (242), a demultiplexer (246), a shift register (240), and digital switches (210, 212) composed of logic gates (214, 216, 218) with outputs of the switches connected through internal conductors (220, 228) to output pins (222, 230), PCB traces (224, 232), and test points (144, 234).

The signal identification logic (254) of FIG. 4, however, unlike the signal identification logic (254) of FIG. 3, includes memory (258), connected between the counter (242) and the shift register (240), and driven by the counter output (266).

The memory (258) contains a list (260) of signal identities similar to the list set forth above in Table 1, with the contents of the memory sorted according to index values implemented by the output values of the counter as it steps through its count from zero to the number of switch control lines minus one. The memory can, for example, be implemented as a content addressable memory ('CAM') so that driving its input (274) with an address automatically presents corresponding content on its output (276). In this way, the contents of the memory location so addressed are always the actual identity of the signal driven through the output pin driven by the switch currently activated by the one switch control line corresponding to the present counter value, the value driven onto the address inputs $A_0 \ldots A_n$ of the demultiplexer, and the address driven onto the address inputs (274) of the memory. That is, signal identification logic (254) of FIG. 4 finds, in dependence upon the demultiplexer address in a list (260) of signal identities, the identity of the signal currently driven through the output pin that is currently connected by one of the switches to the output of the shift register. What the shift register shifts to its output (272), therefore, is not an encoded value representing an identity of a signal, but the actual full identity of the signal as such, read from the list (260) in memory (258).

Figure 5:
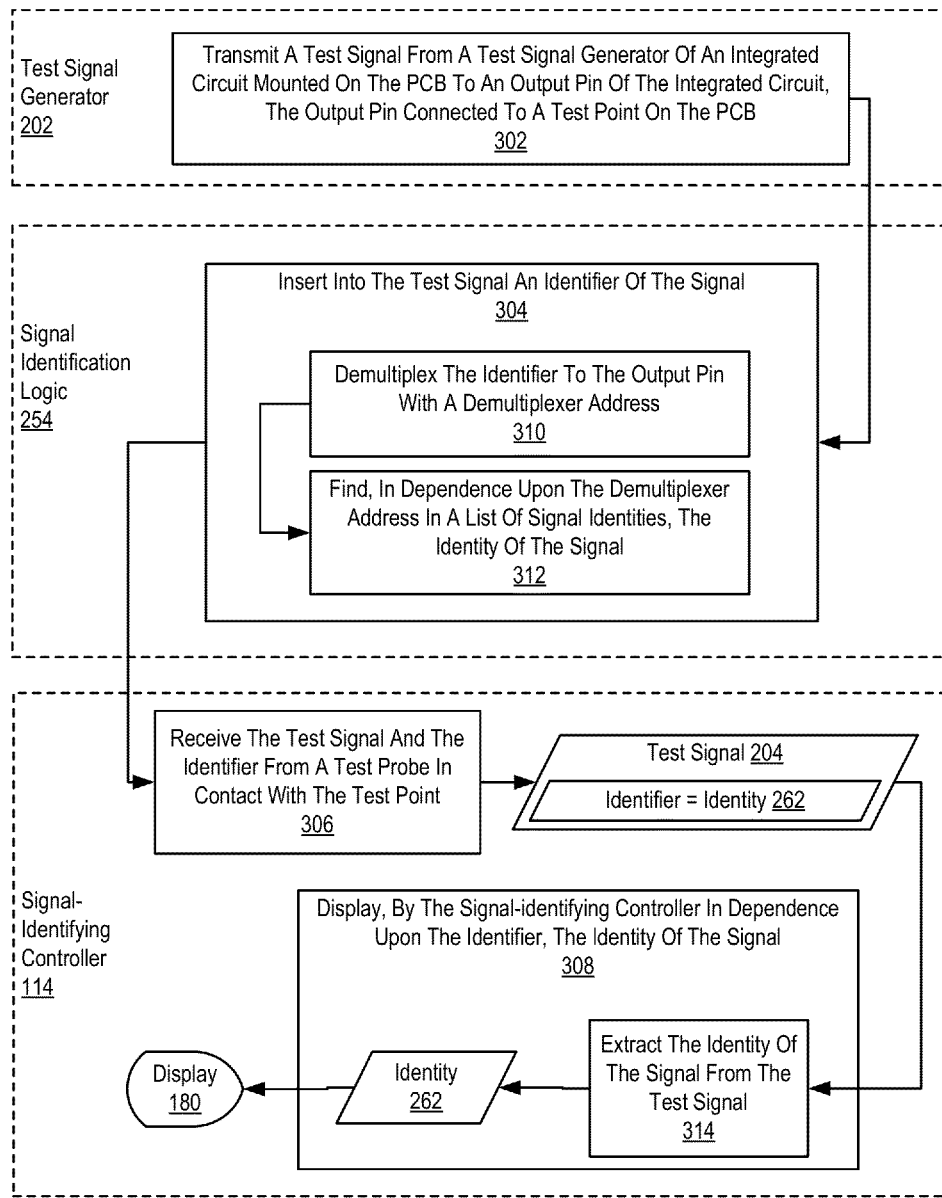
FIGS. 5-7 set forth flow charts illustrating example methods of identifying a signal on a PCB under test according to embodiments of the present invention.

For further explanation, FIG. 5 sets forth a flow chart illustrating an example method of identifying signals on a PCB according to embodiments of the present invention. The method of FIG. 5 is implemented on apparatus like that described and illustrated above with reference to FIGS. 1 and 4. The method of FIG. 5 is therefore explained here with reference not only to FIG. 5 but also to FIGS. 1 and 4, using reference numbers from all three drawings. The method of FIG. 5 includes transmitting (302) a test signal (204) from a test signal generator (202) of an integrated circuit (126) mounted on the PCB (102) to an output pin (222) of the integrated circuit, with the output pin connected to a test point (144) on the PCB.

The method of FIG. 5 also includes inserting (304), by signal identification logic (254) of the integrated circuit (126) into the test signal (204), an identifier (208) of the signal. In an embodiment, the identifier is inserted continually, but in other embodiments, the signal identification logic inserts the identifier periodically at predetermined intervals. In an embodiment with 16 counter output lines (266) and 256 switch control lines, setting the counter clock (238) frequency to 256 hertz inserts a identifier of the signal into the test signal output on each output pin once per second—representing a minimal disruption of the test signal with the insertion of the identifier. In the example method of FIG. 5, the identifier (208) of the signal include the identity (262) of the signal, and inserting (304) an identifier of the signal include demultiplexing (310) the identifier to the output pin with a demultiplexer address $A_0 \ldots A_n$, and finding (312), in dependence upon the demultiplexer address in a list (260) of signal identities, the identity of the signal.

The method of FIG. 5 also includes receiving (306), by a signal-identifying controller (114) from a test probe (104) in contact with the test point (114), the test signal (204) and the identifier (208). The method of FIG. 5 also includes displaying (308), by the signal-identifying controller (114) in dependence upon the identifier (208), the identity of the signal. In the method of FIG. 5, where the identifier of the signal includes the identity (262) of the signal, displaying (308) the identity of the signal includes extracting (314) the identity (262) of the signal from the test signal.

Figure 6:
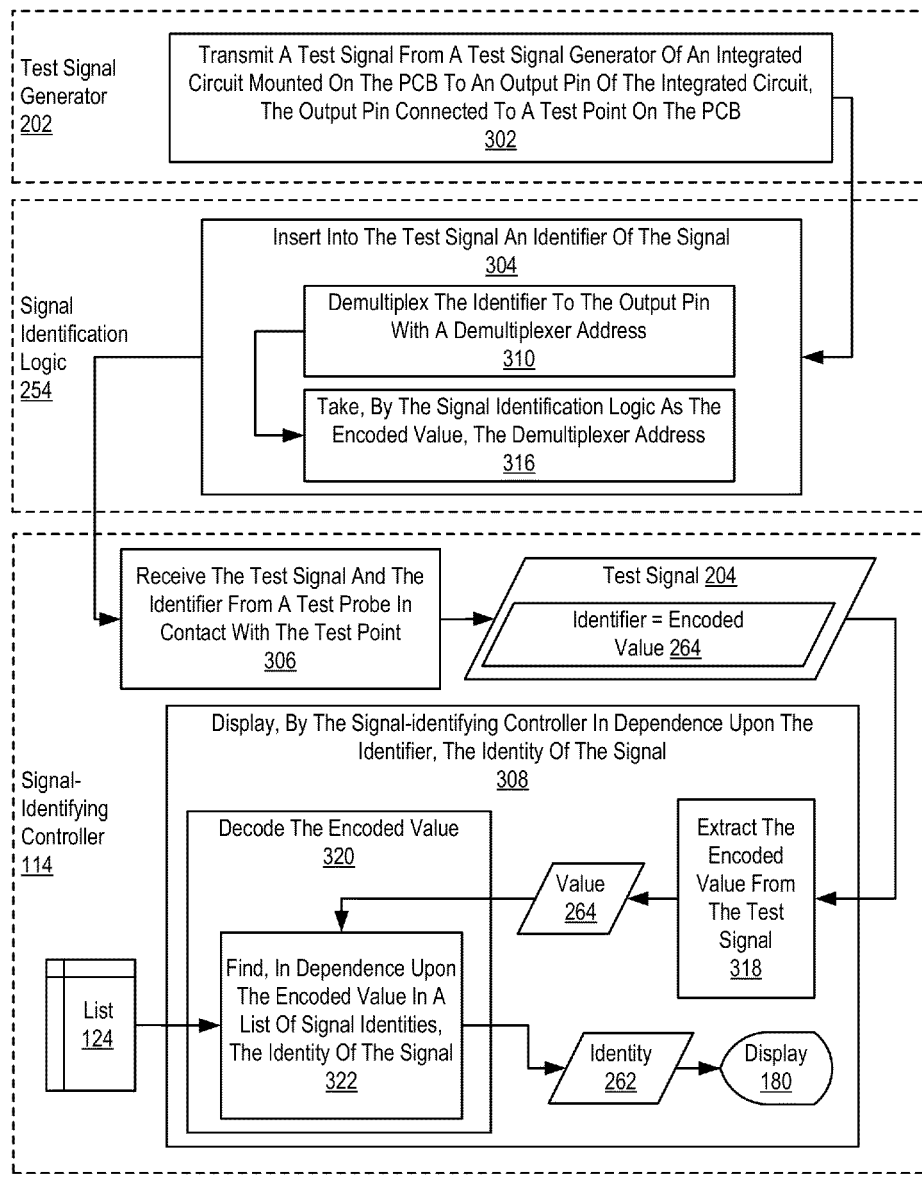

For further explanation, FIG. 6 sets forth a flow chart illustrating a further example method of identifying signals on a PCB according to embodiments of the present invention. The method of FIG. 6 is implemented on apparatus like that described and illustrated above with reference to FIGS. 1 and 3. The method of FIG. 6 is therefore explained here with reference not only to FIG. 6 but also to FIGS. 1 and 3, using reference numbers from all three drawings. The method of FIG. 6 includes transmitting (302) a test signal (204) from a test signal generator (202) of an integrated circuit (126) mounted on the PCB (102) to an output pin (222) of the integrated circuit, with the output pin connected to a test point (144) on the PCB.

The method of FIG. 6 also includes inserting (304), by signal identification logic (254) of the integrated circuit (126) into the test signal (204), an identifier (208) of the signal. In the example method of FIG. 6, the identifier (208) of the signal is composed of only an encoded value that represents the identity (262) of the signal. In the method of FIG. 6, inserting (304) an identifier of the signal includes demultiplexing (310) the identifier to the output pin with a demultiplexer address $A_0 \ldots A_n$, and taking (316), by the signal identification logic as the encoded value, the demultiplexer address.

The method of FIG. 6 also includes receiving (306), by a signal-identifying controller (114) from a test probe (104) in contact with the test point (114), the test signal (204) and the identifier (208). The method of FIG. 6 also includes displaying (308), by the signal-identifying controller (114) in dependence upon the identifier (208), the identity of the signal. In the method of FIG. 6, where the identifier of the signal is composed of only an encoded value that represents the identity (262) of the signal, displaying (308) the identity of the signal includes extracting (318) the encoded value (264) from the test signal (204) and decoding (320) the encoded value. In the example of FIG. 6, the decoding (320) is carried out by finding (322), in dependence upon the encoded value in a list (260) of signal identities, the identity (262) of the signal.

Figure 7:
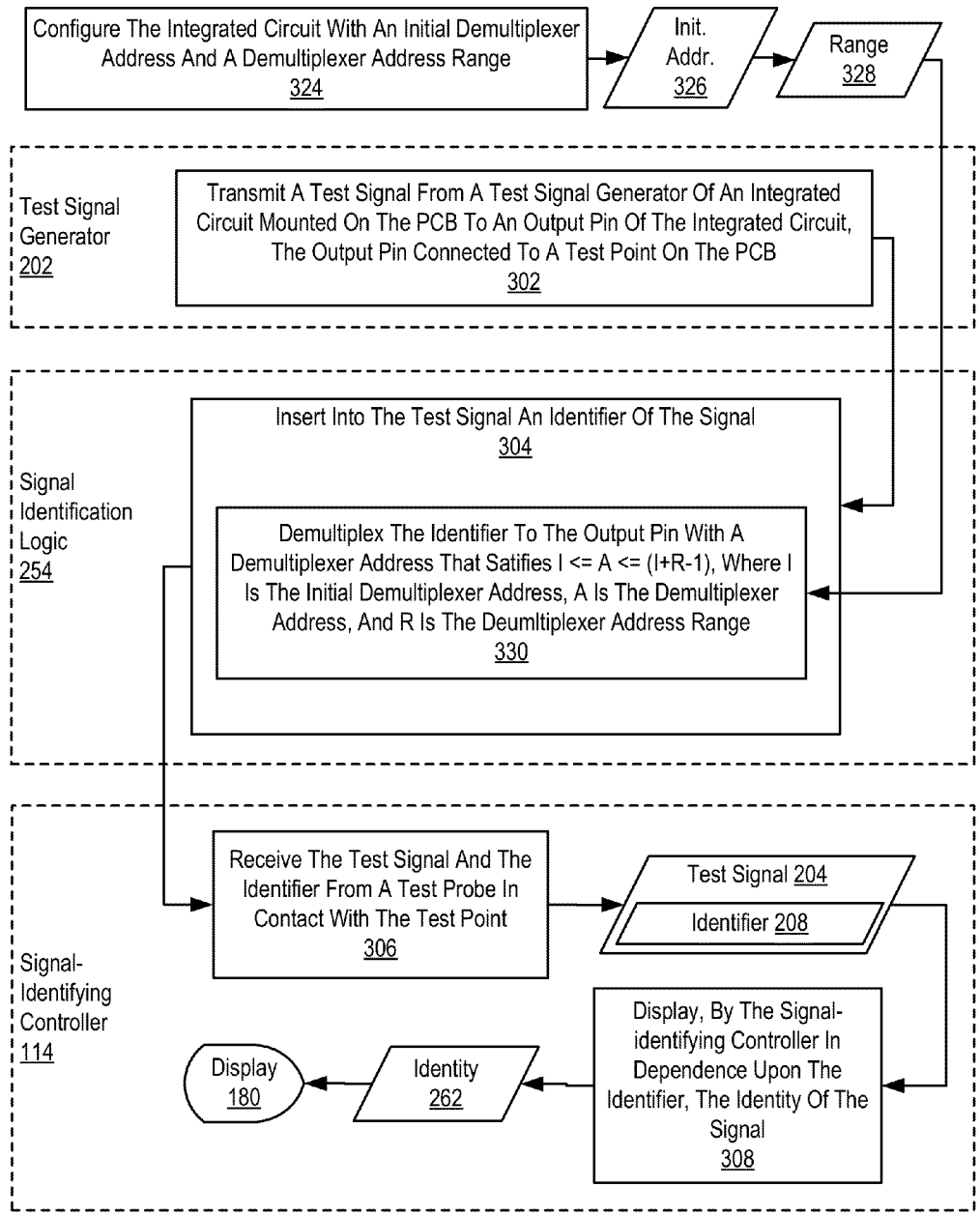

For further explanation, FIG. 7 sets forth a flow chart illustrating an example method of identifying signals on a PCB according to embodiments of the present invention. The method of FIG. 7 is implemented on apparatus like that described and illustrated above with reference to FIGS. 1 and 3. The method of FIG. 7 is therefore explained here with reference not only to FIG. 7 but also to FIGS. 1 and 3, using reference numbers from all three drawings. The method of FIG. 7 includes configuring (324) the integrated circuit (126) with an initial demultiplexer address (326) and a demultiplexer address range (328). Such a configuring can be carried out by storing the initial demultiplexer address (326) and the demultiplexer address range (328) in memory in the integrated circuit, either at the time of manufacture, using non-volatile memory, or at test time. The method of FIG. 7 also includes transmitting (302) a test signal (204) from a test signal generator (202) of an integrated circuit (126) mounted on the PCB (102) to an output pin (222) of the integrated circuit, with the output pin connected to a test point (144) on the PCB.

The method of FIG. 7 also includes inserting (304), by signal identification logic (254) of the integrated circuit (126) into the test signal (204), an identifier (208) of the signal. In the method of FIG. 7, inserting (304) an identifier (208) of the signal includes demultiplexing (330) the identifier (208) to the output pin with a demultiplexer address $A_0 \ldots A_n$ that satisfies $I<=A<=(I+R-1)$, where I is the initial demultiplexer address (326), A is the value of the demultiplexer address, and R is the demultiplexer address range (328). Such demultiplexing is implemented by programming the counter (242) to begin its count at the value of the initial demultiplexer address and conclude its count at the value I+R−1, then wrapping around to begin again with the initial demultiplexer address.

This method supports multiple integrated circuits with signal identification logic on the same PCB under test by making each identifier of a signal unique across all of the integrated circuits with signal identification logic on the same PCB— because each integrated circuits with signal identification logic on the same PCB is assigned a separate initial multiplexer address and a demultiplexer address range that does not overlap with the demultiplexer address range assigned to any other integrated circuit with signal identification logic on the same PCB. If, for example, both integrated circuits (126, 130) have signal identification logic (254), both integrated circuits are sending test signals (204) to fifty output pins, integrated circuit (126) is configured with initial demultiplexer value=0 and with demultiplexer range=50, integrated circuit (139) is configured with initial demultiplexer value=50 and with demultiplexer range=50, then the counter (242) in integrated circuit (126) drives its demultiplexer with demultiplexer addresses in the range 0-49, and the counter (242) in integrated circuit (130) drives its demultiplexer with demultiplexer addresses in the range 50-99. In this way, a signal-identifying controller (114) uses the same list (260) for all signal identities in both integrated circuits, able to find in the list signal identities for both integrated circuits because the encoded values resulting from such demultiplexing are unique across both integrated circuits. The same method can be extended to any number of integrated circuits having signal identification logic (254) that support identifying signals on a PCB according to embodiments of the present invention.

The method of FIG. 7 also includes receiving (306), by a signal-identifying controller (114) from a test probe (104) in contact with the test point (114), the test signal (204) and the identifier (208). The method of FIG. 7 also includes displaying (308), by the signal-identifying controller (114) in dependence upon the identifier (208), the identity of the signal.

Example embodiments of the present invention are described largely in the context of a fully functional computer system for identifying a signal on a PCB under test. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, that is as apparatus, or as a method or a computer program product. Accordingly, aspects of the present invention may take the form of an entirely hardware embodiment, embodiments that are at least partly software (including firmware, resident software, micro-code, etc.), with embodiments combining software and hardware aspects that may generally be referred to herein as a "circuit," "module," "apparatus," or "system."

Furthermore, aspects of the present invention may take the form of a computer program product embodied in one or more computer readable media having computer readable program code embodied thereon. Any combination of one or more computer readable media may be utilized. A computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in a flowchart or block diagram may represent a module, segment, or portion of code or other automated computing machinery, which comprises one or more executable instructions or logic blocks for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

The invention claimed is:

1. A method of identifying a signal on a printed circuit board ('PCB') under test, the method comprising:
   transmitting a test signal from a test signal generator of an integrated circuit mounted on the PCB to an output pin of the integrated circuit, the output pin connected to a test point on the PCB;
   inserting, by signal identification logic of the integrated circuit into the test signal, an identifier of the signal, wherein the identifier of the signal comprises the identity of the signal;
   receiving, by a signal-identifying controller from a test probe in contact with the test point, the test signal including the identifier;
   displaying, on a display of the signal-identifying controller, in dependence upon the identifier, the identity of the signal, including extracting the identity of the signal from the test signal.

2. The method of claim 1 wherein the identity of the signal comprises one or more of: a component name, a pin name, a schematic symbol name, and a signal name.

3. The method of claim 1 wherein inserting into the test signal an identifier of the signal further comprises inserting the identifier periodically at predetermined intervals.

4. The method of claim 1 wherein the identifier of the signal comprises the identity of the signal, and inserting an identifier of the signal further comprises:
   demultiplexing the identifier to the output pin with a demultiplexer address; and
   finding, in dependence upon the demultiplexer address in a list of signal identities, the identity of the signal.

5. The method of claim 1 wherein:
   the identifier of the signal comprises only an encoded value that represents the identity of the signal;
   inserting an identifier of the signal further comprises demultiplexing the identifier to the output pin with a demultiplexer address; and
   the method further comprises taking, by the signal identification logic as the encoded value, the demultiplexer address.

6. The method of claim 1 wherein:
   the identifier of the signal comprises only an encoded value that represents the identity of the signal; and
   displaying the identity of the signal further comprises extracting the encoded value from the test signal and decoding the encoded value.

7. The method of claim 1 wherein:
   the identifier of the signal comprises only an encoded value that represents the identity of the signal; and
   displaying the identity of the signal further comprises extracting the encoded value from the test signal and decoding the encoded value, including finding, in dependence upon the encoded value in a list of signal identities, the identity of the signal.

8. The method of claim 1 wherein:
   the method further comprises configuring the integrated circuit with an initial demultiplexer address and a demultiplexer address range; and
   inserting an identifier of the signal further comprises demultiplexing the identifier to the output pin with a demultiplexer address that satisfies I <=A <=(I+R-1), where I is the initial demultiplexer address, A is the demultiplexer address, and R is the demultiplexer address range.

9. Apparatus for identifying a signal on a printed circuit board ('PCB') under test, the apparatus comprising:
   a PCB under test, including an integrated circuit mounted on the PCB, the integrated circuit comprising a test signal generator that functions by transmitting a test signal to an output pin of the integrated circuit, the output pin connected to a test point on the PCB;
   the integrated circuit further comprising signal identification logic that functions by inserting, into the test signal, an identifier of the signal, wherein the identifier of the signal comprises the identity of the signal;
   a test probe in contact with the test point; and
   a signal-identifying controller that functions by receiving from the test probe the test signal including the identifier and displaying, in dependence upon the identifier, the identity of the signal on a display of the signal-identifying controller.

10. The apparatus of claim 9 wherein the identifier of the signal comprises the identity of the signal, and inserting an identifier of the signal further comprises:
    demultiplexing the identifier to the output pin with a demultiplexer address; and
    finding, in dependence upon the demultiplexer address in a list of signal identities, the identity of the signal.

11. The apparatus of claim 9 wherein:
    the identifier of the signal comprises only an encoded value that represents the identity of the signal;
    inserting an identifier of the signal further comprises demultiplexing the identifier to the output pin with a demultiplexer address; and
    the method further comprises taking, by the signal identification logic as the encoded value, the demultiplexer address.

12. The apparatus of claim 9 wherein:
    the identifier of the signal comprises only an encoded value that represents the identity of the signal; and
    displaying the identity of the signal further comprises extracting the encoded value from the test signal and decoding the encoded value.

13. The apparatus of claim 9 wherein:
    the identifier of the signal comprises only an encoded value that represents the identity of the signal; and
    displaying the identity of the signal further comprises extracting the encoded value from the test signal and decoding the encoded value, including finding, in dependence upon the encoded value in a list of signal identities, the identity of the signal.

14. A computer program product for identifying a signal on a printed circuit board ('PCB') under test, the computer program product disposed upon a computer readable storage medium, the computer program product comprising computer program instructions capable, when executed, of causing automated signal-identifying apparatus to function by:
    transmitting a test signal from a test signal generator of an integrated circuit mounted on the PCB to an output pin of the integrated circuit, the output pin connected to a test point on the PCB;
    inserting, by signal identification logic of the integrated circuit into the test signal, an identifier of the signal, wherein the identifier of the signal comprises the identity of the signal;
    receiving, by a signal-identifying controller from a test probe in contact with the test point, the test signal including the identifier;
    displaying, on a display of the signal-identifying controller, in dependence upon the identifier, the identity of the signal, including extracting the identity of the signal from the test signal.

15. The computer program product of claim 14 wherein the identifier of the signal comprises the identity of the signal, and inserting an identifier of the signal further comprises:
    demultiplexing the identifier to the output pin with a demultiplexer address; and
    finding, in dependence upon the demultiplexer address in a list of signal identities, the identity of the signal.

16. The computer program product of claim 14 wherein:
    the identifier of the signal comprises only an encoded value that represents the identity of the signal;
    inserting an identifier of the signal further comprises demultiplexing the identifier to the output pin with a demultiplexer address; and
    the method further comprises taking, by the signal identification logic as the encoded value, the demultiplexer address.

17. The computer program product of claim 14 wherein:
    the identifier of the signal comprises only an encoded value that represents the identity of the signal; and displaying the identity of the signal further comprises extracting the encoded value from the test signal and decoding the encoded value.

* * * * *